(12) United States Patent
Liu et al.

(10) Patent No.: US 11,630,144 B2
(45) Date of Patent: Apr. 18, 2023

(54) IN-SITU MONITORING METHOD AND APPARATUS FOR POWER ELECTRONIC DEVICE EXPLOSION

(71) Applicant: WUHAN UNIVERSITY, Hubei (CN)

(72) Inventors: Sheng Liu, Hubei (CN); Zhiwen Chen, Hubei (CN); Guoyou Liu, Hubei (CN); Fang Dong, Hubei (CN); Li Liu, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 0 days.

(21) Appl. No.: 17/850,958

(22) Filed: Jun. 27, 2022

(65) Prior Publication Data

US 2023/0029364 A1    Jan. 26, 2023

(30) Foreign Application Priority Data

Jul. 20, 2021 (CN) .......................... 202110818568.4

(51) Int. Cl.
*G01D 21/02* (2006.01)
*G01R 31/00* (2006.01)
*G01R 31/302* (2006.01)
*G01R 31/308* (2006.01)

(52) U.S. Cl.
CPC ......... *G01R 31/003* (2013.01); *G01R 31/302* (2013.01); *G01R 31/308* (2013.01)

(58) Field of Classification Search
None
See application file for complete search history.

(56) References Cited

FOREIGN PATENT DOCUMENTS

| CN | 101846534 | 9/2010 | |
|---|---|---|---|
| CN | 102483965 | 5/2012 | |
| CN | 102778257 | 11/2012 | |
| CN | 105973690 | 9/2016 | |
| CN | 111795977 A | * 10/2020 | ............ B33Y 30/00 |
| CN | 112785889 | 5/2021 | |
| IN | 3013CHE1997 | 6/2008 | |
| WO | 2010138607 | 12/2010 | |

OTHER PUBLICATIONS

English translation of CN-111795977-A published 2020 (Year: 2020).*
"Search Report of China Counterpart Application", with English translation thereof, dated Dec. 23, 2021, p. 1-p. 5.

* cited by examiner

*Primary Examiner* — Jermele M Hollington
(74) *Attorney, Agent, or Firm* — JCIP Global Inc.

(57) ABSTRACT

The present invention discloses an in-situ monitoring method and apparatus for a power electronic device explosion. A power electronic device is excited to produce an explosion failure by using a fault excitation module. An electrical signal of the power electronic device is monitored in real time by using an electrical signal monitoring module. Gas information of a test cavity is monitored in real time by using a gas monitoring module. External pictures of the power electronic device are captured by using a high-speed image capturing module. Internal pictures of the power electronic device are captured by using a high-speed X-ray imaging module. Each module in the apparatus is triggered to work according to a predetermined time sequence and time interval by using a time sequence control module. The entire apparatus is controlled and data is acquired, stored, and displayed by using a main control module.

16 Claims, 1 Drawing Sheet

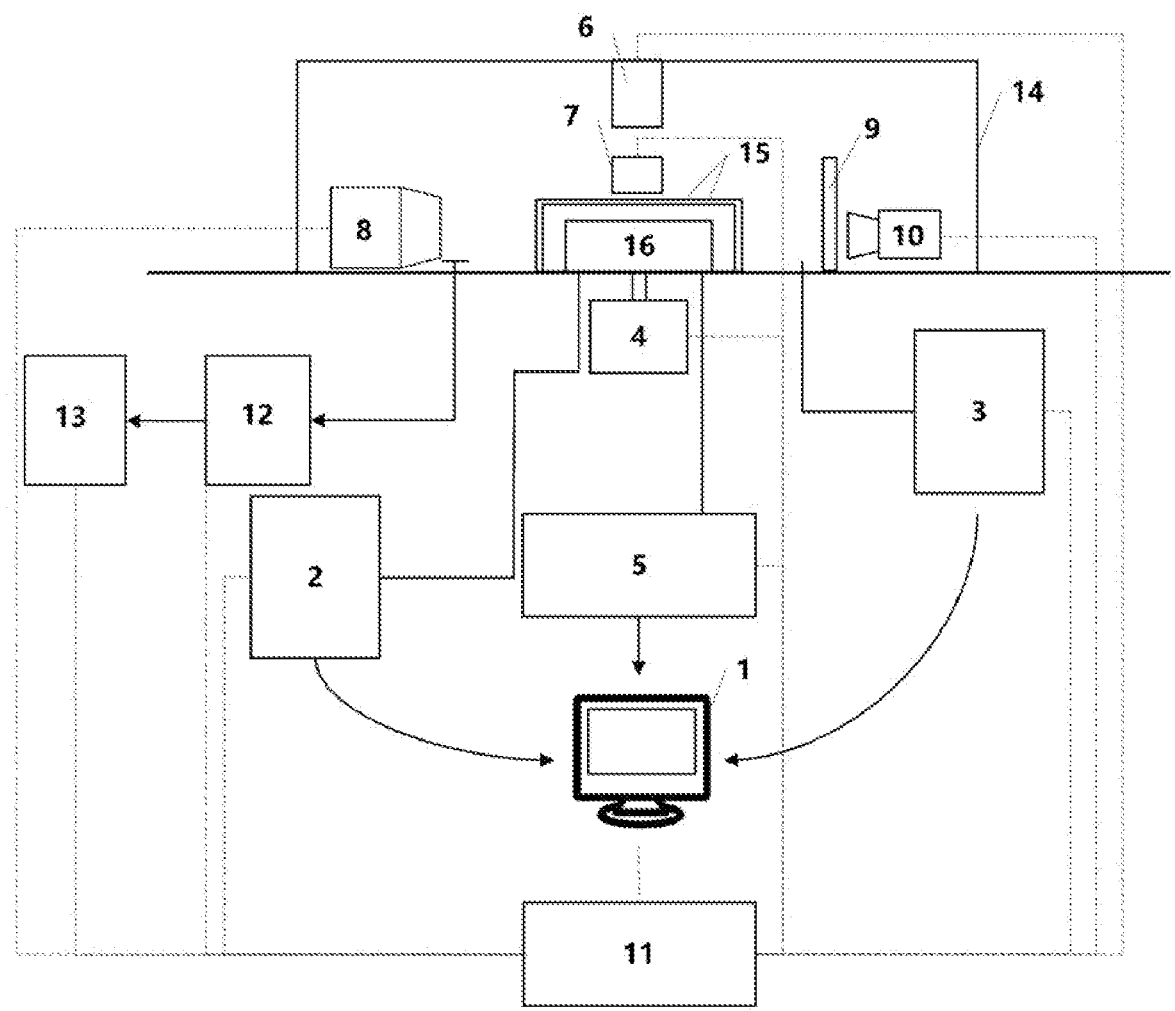

IN-SITU MONITORING METHOD AND APPARATUS FOR POWER ELECTRONIC DEVICE EXPLOSION

CROSS-REFERENCE TO RELATED APPLICATIONS

This application claims the priority benefit of China application no. 202110818568.4 filed on Jul. 20, 2021. The entirety of each of the above-mentioned patent applications is hereby incorporated by reference herein and made a part of this specification.

TECHNICAL FIELD

The present invention belongs to the field of electronic device monitoring technologies, and more specifically, relates to an in-situ monitoring method and apparatus for a power electronic device explosion.

BACKGROUND

High power, high frequency and integration are main development directions of power electronic devices. MW-level high-power inverters are widely applied to fields such as rail transit and power transmission networks. However, during a working process of a high-power electronic device, if the device works abnormally (for example, overloaded or short-circuited), loss of the device increases significantly, and a large quantity of heat is generated in a short period, resulting in an instantaneous increase in the temperature of the device, which is very likely to cause an explosion. Particularly in the application of an ultra-high voltage and a high current, the consequence of the power device explosion is more serious.

The explosion of the power electronic device may cause possible damage including releasing gas, or aerosols composed of colloids and particles being cladded on the surface. If a larger and heavier debris is generated, it will cause serious damage to surrounding devices, systems or human bodies. Therefore, studying an explosion mechanism of high-power electronic devices is crucial for an explosion-proof design of devices and an improvement of device safety.

In the prior art, due to an extremely short duration of an explosion process of the high-power electronic device, usually in a microsecond level, there is a lack of an effective in-situ observation and analysis method, leading to still controversial causes for the explosion of the power electronic device. Currently, the common causes are an excessive current, damaged insulation protection, overheating, excessive humidity, or the like. However, due to the lack of in-situ observation and analysis method, a dominant factor of the explosion cannot be analyzed for a specific product, and therefore targeted improvement and design optimization cannot be performed.

SUMMARY

The present invention provides an in-situ monitoring method and apparatus for a power electronic device explosion to resolve the problem of a lack of an in-situ monitoring method for the explosion of a power electronic device in the prior art.

The present invention provides an in-situ monitoring apparatus for a power electronic device explosion, comprising: a fault excitation module, an electrical signal monitoring module, a gas monitoring module, a high-speed image capturing module, a high-speed X-ray imaging module, a time sequence control module, a safety protection module, and a main control module.

The fault excitation module is configured to excite a power electronic device to produce an explosion failure.

The electrical signal monitoring module is configured to monitor an electrical signal of the power electronic device in real time.

The gas monitoring module is configured to monitor gas information of a test cavity in which the power electronic device is located in real time.

The high-speed image capturing module is configured to capture external pictures of the power electronic device before the explosion failure, at a moment of the explosion failure, and after the explosion failure.

The high-speed X-ray imaging module is configured to capture internal pictures of the power electronic device before the explosion failure, at the moment of the explosion failure, and after the explosion failure.

The time sequence control module is configured to trigger each module in the apparatus to work according to a predetermined time sequence and time interval.

The safety protection module is configured to protect test people and test instruments except for the power electronic device from explosion damage of the power electronic device.

The main control module is configured to control the entire apparatus, and to acquire, store, and display data.

In some embodiments, the fault excitation module comprises: a power supply and load apparatus and a temperature-humidity-environmental atmosphere integrated control apparatus.

The power supply and load apparatus is configured to control electrical load parameters of the power electronic device.

The temperature-humidity-environmental atmosphere integrated control apparatus is configured to adjust a temperature, humidity, and gas composition of an environment in which the power electronic device is located.

In some embodiments, the fault excitation module further comprises a vibration platform. The vibration platform is configured to apply a vibrational load to the power electronic device.

In some embodiments, the high-speed image capturing module comprises an ultrafast imaging subsystem and an ultrafast temperature measurement subsystem.

The ultrafast imaging subsystem and the ultrafast temperature measurement subsystem both use a modulated laser as detection light, and are respectively configured to acquire visible light information and temperature information of the power electronic device.

In some embodiments, the high-speed X-ray imaging module comprises a pulsed X-ray source, an ultrafast afterglow fluorescent screen, and a high-speed camera.

An ultrashort pulsed X-ray is emitted by the pulsed X-ray source, and is converted into visible light on the ultrafast afterglow fluorescent screen to be imaged, and the image of the visible light is captured by the high-speed camera.

In some embodiments, the safety protection module comprises an X-ray shield layer and an optical protection cover.

The power electronic device is arranged in the optical protection cover, and the optical protection cover, the high-speed image capturing module, the high-speed X-ray imaging module all are arranged in the X-ray shield layer.

In some embodiments, the gas monitoring module comprises a trace gas sampling device and a gas composition analysis device.

The trace gas sampling device is configured to acquire a gas sample inside the test cavity.

The gas composition analysis device is configured to analyze a change of a gas chromatogram of the test cavity during explosion of the power electronic device based on the acquired gas sample, to monitor a change of gas composition inside the test cavity.

In some embodiments, the high-speed image capturing module captures visible light information and temperature information of the power electronic device at a rate not less than 200,000 frames per second.

In some embodiments, the pulsed X-ray resource and the ultrafast afterglow fluorescent screen image an interior of the power electronic device at a rate not less than 200,000 frames per second.

On the other hand, the present invention provides an in-situ monitoring method for a power electronic device explosion, implemented by the foregoing in-situ monitoring apparatus for a power electronic device explosion, the method including the following steps.

Excite a power electronic device to produce an explosion failure by using a fault excitation module.

Monitor an electrical signal of the power electronic device in real time by using an electrical signal monitoring module before the explosion failure, at a moment of the explosion failure, and after the explosion failure of the power electronic device. Monitor gas information of a test cavity in which the power electronic device is located in real time by using a gas monitoring module. Capture external pictures of the power electronic device by using a high-speed image capturing module. Capture internal pictures of the power electronic device by using a high-speed X-ray imaging module.

Trigger each module in the apparatus to work according to a predetermined time sequence and time interval by using a time sequence control module.

Control the entire apparatus, and acquire, store, and display data by using a main control module.

One or more technical solutions provided in the present invention have at least the following technical effects or advantages:

In the present invention, the entire apparatus is controlled and data is acquired, stored and displayed by using the main control module, each module in the apparatus is triggered to work according to a predetermined time sequence and time interval by using the time sequence control module, the power electronic device is excited to produce an explosion failure under the action of one or more factors by using the fault excitation module, an electrical signal of a whole or local sample during a test is acquired by using the electrical signal monitoring module, gas information inside a test cavity in which the sample is located during the test is acquired by using the gas monitoring module, online/real-time monitoring of external damage of the power electronic device during the explosion failure process is implemented by using the high-speed image capturing module, and an internal damage evolution mechanism of the device is captured by using the high-speed X-ray imaging module. The present invention can implement real-time monitoring of the explosion failure process of the power electronic device, and change the current state of a lack of in-situ analysis technologies for an instantaneous explosion failure process of the power electronic device in the industry.

BRIEF DESCRIPTION OF THE DRAWINGS

The FIGURE is a schematic diagram of an in-situ monitoring apparatus for a power electronic device explosion according to Embodiment 1 of the present invention.

1. main control module, 2. power supply and load apparatus, 3. temperature-humidity-environmental atmosphere integrated control apparatus, 4. vibration platform, 5. electrical signal monitoring module, 6. ultrafast imaging subsystem, 7. ultrafast temperature measurement subsystem, 8. pulsed X-ray source, 9. ultrafast afterglow fluorescent screen, 10. high-speed camera, 11. time sequence control module, 12. trace gas sampling device, 13. gas composition analysis device, 14. X-ray shield layer, 15. Optical protection cover, 16. to-be-tested power electronic device.

DETAILED DESCRIPTION

To make the foregoing technical solutions better understood, the foregoing technical solutions are described below in detail with reference to the accompanying drawings of the specification and specific implementations.

Embodiment 1

Embodiment 1 provides an in-situ monitoring apparatus for a power electronic device explosion, referring to the FIGURE, including: a fault excitation module, an electrical signal monitoring module 5, a gas monitoring module, a high-speed image capturing module, a high-speed X-ray imaging module, a time sequence control module 11, a safety protection module, and a main control module 1.

The fault excitation module is configured to excite a power electronic device to produce an explosion failure. The electrical signal monitoring module 5 is configured to monitor an electrical signal of the power electronic device in real time. The gas monitoring module is configured to monitor gas information of a test cavity in which the power electronic device is located in real time. The high-speed image capturing module is configured to capture external pictures of the power electronic device before the explosion failure, at a moment of the explosion failure, and after the explosion failure. The high-speed X-ray imaging module is configured to capture internal pictures of the power electronic device before the explosion failure, at the moment of the explosion failure, and after the explosion failure. The time sequence control module 11 is configured to trigger each module in the apparatus to work according to a predetermined time sequence and time interval. The safety protection module is configured to protect test people and test instruments except for the power electronic device from explosion damage of the power electronic device. The main control module 1 is configured to control the entire apparatus, and to acquire, store, and display data.

Specifically, the fault excitation module includes: a power supply and load apparatus 2 and a temperature-humidity-environmental atmosphere integrated control apparatus 3. The power supply and load apparatus 2 is configured to control electrical load parameters (such as a current or a voltage) of the power electronic device. The fault excitation module may implement instantaneous discharge, with a discharge time does not exceed 0.1 ms. An instantaneous peak current not less than 100 kA is induced in a to-be-tested power electronic device 16. The temperature-humidity-environmental atmosphere integrated control apparatus 3 is configured to adjust a temperature, humidity, and gas composition of an environment in which the power electronic device is located.

The temperature, humidity, atmosphere (for example, corrosive atmosphere) of the environment in which the to-be-tested power electronic device 16 and a power supply condition (a load such as an electrical load) of the to-be-tested power electronic device 16 may be adjusted by using the fault excitation module, to cause a serious fault such as an explosion failure of the power electronic device. For example, the explosion failure of the power electronic device is caused by applying one or more loads.

Specifically, the temperature-humidity-environmental atmosphere integrated control apparatus 3 includes: a temperature control submodule, a humidity control submodule, and an environmental atmosphere control submodule. The temperature control submodule is configured to control an external temperature of a sample. The humidity control submodule is configured to control a humidity environment in which the sample is located. The environmental atmosphere control submodule is configured to control gas composition of the environment in which the sample is located.

In addition, in a preferred solution, the fault excitation module may further include: a vibration platform 4. The vibration platform 4 is configured to apply a vibrational load to the power electronic device.

The electrical signal monitoring module 5 is configured to monitor and record an electrical signal such as a current or a voltage waveform of a whole sample or a partial sample.

The gas monitoring module includes a trace gas sampling device 12 and a gas composition analysis device 13. The trace gas sampling device 12 is configured to acquire a gas sample inside the test cavity. The gas composition analysis device 13 is configured to analyze a change of a gas chromatogram of the test cavity during explosion of the power electronic device based on the acquired gas sample, to monitor a change of gas composition inside the test cavity.

The high-speed image capturing module includes an ultrafast imaging subsystem 6 and an ultrafast temperature measurement subsystem 7. The ultrafast imaging subsystem 6 and the ultrafast temperature measurement subsystem 7 both use a modulated laser as detection light, and are respectively configured to acquire visible light information and temperature information of the power electronic device.

Specifically, an image capturing time interval of the high-speed image capturing module is not greater than 50 microseconds. The high-speed image capturing module may image at a frame rate not less than 200,000 frames per second. In addition, an imaging method of the high-speed image capturing module may be an ultrafast imaging system based on a laser or a high-speed camera based on conventional visible light. An imaging range may include different wave bands such as visible light or infrared.

A picture during the failure process of the power electronic device may be obtained by using the high-speed image capturing module, which may be specifically composed of a single or a plurality of picture capturing devices to capture a failure feature (such as an explosion, an electric arc, or a temperature distribution). For example, information such as visible light or temperature of the sample is captured at a rate not less than one million frames per second.

The high-speed X-ray imaging module includes a pulsed X-ray source 8, an ultrafast afterglow fluorescent screen 9, and a high-speed camera 10. An ultrashort pulsed X-ray is emitted by the pulsed X-ray source 8, and is converted into visible light on the ultrafast afterglow fluorescent screen 9 to be imaged, and the image of the visible light is captured by the high-speed camera 10.

An internal damage evolution of the device during the explosion of the power electronic device may be obtained by using the high-speed X-ray imaging module. For example, the pulsed X-ray source 8 and the ultrafast afterglow fluorescent screen 9 image an interior of the sample at a rate not less than 500,000 frames per second.

Specifically, an image capturing time interval of the high-speed X-ray imaging module is not greater than 50 microseconds. The high-speed X-ray imaging module may penetrate and image the to-be-tested device at a frame rate not less than 200,000 frames per second.

The time sequence control module 11 is connected to all functional modules, and triggers each module to work at a predetermined time sequence and interval, to accurately capture key information of the power electronic device at a protection moment.

Specifically, a time resolution of the time sequence control module 11 is not less than 1 microsecond.

The safety protection module includes an X-ray shield layer 14 and an optical protection cover 15. The optical protection cover 15 may be a double-layer optical airtight protection cover, specifically an isolation panel with sufficient strength, which may isolate the power electronic device from surrounding people or devices, and avoid damage to the people or the devices caused by the power electronic device. There is an interface at a corresponding position on the isolation panel to help another device in the system to monitor and adjust the tested sample. The isolation panel may be made of a transparent, translucent, or opaque material.

The main control module 1 is configured to control the entire system, and to acquire, display and store a signal of each module. The main control module 1 is respectively connected to the fault excitation module, the high-speed image capturing module, the high-speed X-ray imaging module, and the time sequence control module 11, to acquire an output signal and output a control signal.

During the test, an instantaneous voltage and current that the tested device withstands is controlled by the power supply and load apparatus 2. An environmental condition of the tested device is adjusted by using the temperature-humidity-environmental atmosphere integrated control apparatus 3. A vibration environment in which the tested device is located is simulated by using the vibration platform 4, which causes the tested device to explode, and simultaneously starts the ultrafast imaging subsystem 6, the ultrafast temperature measurement subsystem 7, the pulsed X-ray source 8, and the ultrafast afterglow fluorescent screen 9, and the high-speed camera 10 to perform high-speed imaging of an external damage process, a temperature change, and an internal damage process of the tested device at the moment of explosion, to implement in-situ monitoring of the power electronic device explosion, and provide a basis for analyzing an explosion destructive force of the sample and a main driving factor.

Embodiment 2

Embodiment 2 provides an in-situ monitoring method for the explosion of a power electronic device by using the apparatus provided in the Embodiment 1, the method including:

exciting a power electronic device to produce an explosion failure by using a fault excitation module;

monitoring an electrical signal of the power electronic device in real time by using an electrical signal monitoring module before the explosion failure, at a moment of the explosion failure, and after the explosion failure of the power electronic device, monitoring gas information of a test cavity in which the power electronic device is located in real time by using a gas monitoring module, capturing external pictures of the power electronic device by using a high-speed image capturing module, and capturing internal pictures of the power electronic device by using a high-speed X-ray imaging module;

triggering each module in the apparatus to work according to a predetermined time sequence and time interval by using a time sequence control module; and controlling the entire apparatus, and acquiring, storing, and displaying data by using a main control module.

To sum up, the present invention can effectively reproduce the explosion failure of the power electronic device, effectively analyze an impact of a single factor (such as a current magnitude, temperature, or humidity) on the explosion failure of the power electronic device, and deeply analyze a main mechanism of the explosion failure of the power electronic device. The present invention can implement real-time monitoring of the explosion failure process of the power electronic device, and change the current state of a lack of in-situ analysis technologies for an instantaneous explosion failure process of the power electronic device in the industry.

Finally, it should be noted that, the foregoing specific implementations are merely used for describing the technical solutions of the present invention rather than limiting the present invention. Although the present invention is described in detail with reference to the embodiments, a person of ordinary skill in the art should understand that, modifications or equivalent replacements may be made to the technical solutions of the present invention without departing from the spirit and scope of the technical solutions of the present invention, which shall fall within the scope of the claims of the present invention.

What is claimed is:

1. An in-situ monitoring apparatus for a power electronic device explosion, comprising: a fault excitation module, an electrical signal monitoring module, a gas monitoring module, a high-speed image capturing module, a high-speed X-ray imaging module, a time sequence control module, a safety protection module, and a main control module, the fault excitation module being configured to excite a power electronic device to produce an explosion failure;

the electrical signal monitoring module being configured to monitor an electrical signal of the power electronic device in real time;

the gas monitoring module being configured to monitor gas information of a test cavity in which the power electronic device is located in real time;

the high-speed image capturing module being configured to capture external pictures of the power electronic device before the explosion failure, at a moment of the explosion failure, and after the explosion failure;

the high-speed X-ray imaging module being configured to capture internal pictures of the power electronic device before the explosion failure, at the moment of the explosion failure, and after the explosion failure;

the time sequence control module being connected with the fault excitation module, the electrical signal monitoring module, the electrical signal monitoring module, the gas monitoring module, the high-speed image capturing module, and the high-speed X-ray imaging module, and being configured to trigger the fault excitation module, the electrical signal monitoring module, the gas monitoring module, the high-speed image capturing module, and the high-speed X-ray imaging module to work according to a predetermined time sequence and time interval;

the safety protection module being configured to protect test people and test instruments except for the power electronic device from explosion damage of the power electronic device, wherein the safety protection module comprises an X-ray shield layer and an optical protection cover, the power electronic device being arranged in the optical protection cover, and the optical protection cover, the high-speed image capturing module, the high-speed X-ray imaging module all being arranged in the X-ray shield layer; and the main control module being connected with the fault excitation module, the electrical signal monitoring module, and the time sequence control module, and being configured to control the in situ monitoring apparatus, and to acquire, store, and display data.

2. The in-situ monitoring apparatus for the power electronic device explosion according to claim 1, wherein the fault excitation module comprises: a power supply and load apparatus, and a temperature-humidity-environmental atmosphere integrated control apparatus, the power supply and load apparatus being configured to control electrical load parameters of the power electronic device, and the temperature-humidity-environmental atmosphere integrated control apparatus is configured to adjust a temperature, humidity, and gas composition of an environment in which the power electronic device is located.

3. The in-situ monitoring apparatus for the power electronic device explosion according to claim 2, wherein the fault excitation module further comprises a vibration platform, the vibration platform being configured to apply a vibrational load to the power electronic device.

4. The in-situ monitoring apparatus for the power electronic device explosion according to claim 1, wherein the high-speed image capturing module comprises an ultrafast imaging subsystem and an ultrafast temperature measurement subsystem, the ultrafast imaging subsystem and the ultrafast temperature measurement subsystem both using a modulated laser as detection light, and being respectively configured to acquire visible light information and temperature information of the power electronic device.

5. The in-situ monitoring apparatus for the power electronic device explosion according to claim 1, wherein the high-speed X-ray imaging module comprises a pulsed X-ray source, an ultrafast afterglow fluorescent screen, and a high-speed camera, an ultrashort pulsed X-ray being emitted by the pulsed X-ray source, and being converted into visible light on the ultrafast afterglow fluorescent screen to be imaged, and the image of the visible light being captured by the high-speed camera.

6. The in-situ monitoring apparatus for the power electronic device explosion according to claim 1, wherein the gas monitoring module comprises a trace gas sampling device, and a gas composition analysis device, the trace gas sampling device being configured to acquire a gas sample inside the test cavity; and the gas composition analysis device being configured to analyze a change of a gas chromatogram of the test cavity during explosion of the power electronic device based on the acquired gas sample, to monitor a change of gas composition inside the test cavity.

7. The in-situ monitoring apparatus for the power electronic device explosion according to claim 1, wherein the high-speed image capturing module captures visible light information and temperature information of the power electronic device at a rate not less than 200,000 frames per second.

8. The in-situ monitoring apparatus for the power electronic device explosion according to claim 5, wherein the pulsed X-ray resource and the ultrafast afterglow fluorescent screen image an interior of the power electronic device at a rate not less than 200,000 frames per second.

9. An in-situ monitoring method for a power electronic device explosion, the method comprising:
exciting a power electronic device to produce an explosion failure by using a fault excitation module;
monitoring an electrical signal of the power electronic device in real time by using an electrical signal monitoring module before the explosion failure, at a moment of the explosion failure, and after the explosion failure of the power electronic device, monitoring gas information of a test cavity in which the power electronic device is located in real time by using a gas monitoring module, capturing external pictures of the power electronic device by using a high-speed image capturing module, and capturing internal pictures of the power electronic device by using a high-speed X-ray imaging module;
triggering the fault excitation module, the electrical signal monitoring module, the gas monitoring module, the high-speed image capturing module, and the high-speed X-ray imaging module to work according to a predetermined time sequence and time interval by using a time sequence control module; and
controlling the in situ monitoring apparatus, and acquiring, storing, and displaying data by using a main control module, wherein the main control module is connected with the fault excitation module, the electrical signal monitoring module, and the time sequence control module.

10. The in-situ monitoring apparatus for the power electronic device explosion according to claim 9, wherein the fault excitation module comprises: a power supply and load apparatus, and a temperature-humidity-environmental atmosphere integrated control apparatus,
the power supply and load apparatus being configured to control electrical load parameters of the power electronic device, and
the temperature-humidity-environmental atmosphere integrated control apparatus is configured to adjust a temperature, humidity, and gas composition of an environment in which the power electronic device is located.

11. The in-situ monitoring apparatus for the power electronic device explosion according to claim 10, wherein the fault excitation module further comprises a vibration platform,
the vibration platform being configured to apply a vibrational load to the power electronic device.

12. The in-situ monitoring apparatus for the power electronic device explosion according to claim 9, wherein the high-speed image capturing module comprises an ultrafast imaging subsystem and an ultrafast temperature measurement subsystem,
the ultrafast imaging subsystem and the ultrafast temperature measurement subsystem both using a modulated laser as detection light, and being respectively configured to acquire visible light information and temperature information of the power electronic device.

13. The in-situ monitoring apparatus for the power electronic device explosion according to claim 9, wherein the high-speed X-ray imaging module comprises a pulsed X-ray source, an ultrafast afterglow fluorescent screen, and a high-speed camera,
an ultrashort pulsed X-ray being emitted by the pulsed X-ray source, and being converted into visible light on the ultrafast afterglow fluorescent screen to be imaged, and the image of the visible light being captured by the high-speed camera.

14. The in-situ monitoring apparatus for the power electronic device explosion according to claim 9, wherein the gas monitoring module comprises a trace gas sampling device, and a gas composition analysis device,
the trace gas sampling device being configured to acquire a gas sample inside the test cavity; and
the gas composition analysis device being configured to analyze a change of a gas chromatogram of the test cavity during explosion of the power electronic device based on the acquired gas sample, to monitor a change of gas composition inside the test cavity.

15. The in-situ monitoring apparatus for the power electronic device explosion according to claim 9, wherein the high-speed image capturing module captures visible light information and temperature information of the power electronic device at a rate not less than 200,000 frames per second.

16. The in-situ monitoring apparatus for the power electronic device explosion according to claim 13, wherein the pulsed X-ray resource and the ultrafast afterglow fluorescent screen image an interior of the power electronic device at a rate not less than 200,000 frames per second.

* * * * *